(12) United States Patent　　(10) Patent No.:　　US 9,785,592 B2
Raikwar et al.　　(45) Date of Patent:　　Oct. 10, 2017

(54) HIGH DENSITY MAPPING FOR MULTIPLE CONVERTER SAMPLES IN MULTIPLE LANE INTERFACE

(71) Applicant: Avago Technologies General IP (Singapore) Pte. Ltd, Singapore (SG)

(72) Inventors: Avinash Kant Raikwar, Bangalore (IN); Amit Kumar Mishra, Cape Town (SA)

(73) Assignee: AVAGO TECHNOLOGIES GENERAL IP (SINGAPORE) PTE. LTD. (SG)

( * ) Notice: Subject to any disclaimer, the term of this patent is extended or adjusted under 35 U.S.C. 154(b) by 786 days.

(21) Appl. No.: 14/170,724

(22) Filed: Feb. 3, 2014

(65) Prior Publication Data

US 2015/0205752 A1　　Jul. 23, 2015

Related U.S. Application Data

(60) Provisional application No. 61/930,078, filed on Jan. 22, 2014.

(51) Int. Cl.
　　*G06F 13/00*　　(2006.01)
　　*G06F 13/40*　　(2006.01)
　　*H03M 1/12*　　(2006.01)
(52) U.S. Cl.
　　CPC ....... *G06F 13/4004* (2013.01); *H03M 1/1215* (2013.01)

(58) Field of Classification Search
　　CPC .... G06F 3/0611; G06F 3/0616; G06F 3/0619; G06F 3/0634; G06F 3/0635; G06F 3/0644; G06F 3/0647; G06F 3/0655; G06F 3/0683; G06F 3/1446; G06F 3/167; G06F 5/015; Y02B 60/1225; Y02B 60/1228
See application file for complete search history.

(56) References Cited

U.S. PATENT DOCUMENTS

| 7,498,965 | B2 | 3/2009 | Jarman et al. ................ 341/155 |
| 7,973,682 | B2 | 7/2011 | Nanevicz ...................... 341/101 |
| 8,390,605 | B2 | 3/2013 | Lin et al. ...................... 345/204 |
| 2011/0211568 | A1* | 9/2011 | Suga ..................... H04L 5/0037 370/341 |
| 2012/0157852 | A1 | 6/2012 | Wegener et al. ............ 600/454 |
| 2013/0259113 | A1* | 10/2013 | Kumar ................ H04L 25/0307 375/233 |
| 2013/0336656 | A1 | 12/2013 | Belansky et al. .............. 398/79 |

* cited by examiner

*Primary Examiner* — Roy Y Yi
(74) *Attorney, Agent, or Firm* — Sheridan Ross P.C.

(57) ABSTRACT

An apparatus having a plurality of buffers, a first circuit and a second circuit is disclosed. The buffers are configured to store a plurality of frames to be transmitted in a plurality of respective lanes of a communication channel. The first circuit is configured to (i) generate a plurality of first groups from a first number of a plurality of samples, at least one of the first groups contains an initial portion of a given one of the samples, and (ii) generate a first of the frames by appending the first groups. The second circuit is configured to (i) receive a final portion of the given sample from the first circuit, (ii) generate a plurality of second groups from the final portion of the given sample and a second number of the samples and (iii) generate a second of the frames by appending the second groups.

20 Claims, 7 Drawing Sheets

HIGH DENSITY MAPPING FOR MULTIPLE CONVERTER SAMPLES IN MULTIPLE LANE INTERFACE

This application relates to U.S. Provisional Application No. 61/930,078, filed Jan. 22, 2014, which is hereby incorporated by reference in its entirety.

FIELD OF THE INVENTION

The invention relates to serial interfaces for data converters generally and, more particularly, to a method and/or apparatus for implementing a high density mapping for multiple converter samples in a multiple lane interface.

BACKGROUND

Standardization of interface protocols to connect high performance data converters and digital signal processing modules is being pursued actively in the semiconductor industry. In mobile communications, the protocols are used for software defined applications, like decision feedback equalizers and remote radio heads, where the interfaces should be highly scalable and flexible in nature. However, the conventional interface designs are poor at scalability and inefficient with communication channel bandwidth.

SUMMARY

The invention concerns an apparatus having a plurality of buffers, a first circuit and a second circuit. The buffers are configured to store a plurality of frames to be transmitted in a plurality of respective lanes of a communication channel. The first circuit is configured to (i) generate a plurality of first groups from a first number of a plurality of samples, at least one of the first groups contains an initial portion of a given one of the samples, and (ii) generate a first of the frames by appending the first groups. The second circuit is configured to (i) receive a final portion of the given sample from the first circuit, (ii) generate a plurality of second groups from the final portion of the given sample and a second number of the samples and (iii) generate a second of the frames by appending the second groups.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the invention include providing a high density mapping for multiple converter samples in a multiple lane interface that may (i) support partial sample transmission and reception over different lanes, (ii) provide high density packing of samples, (iii) utilize a nibble group packing scheme, (iv) provide a modular repetitive and scalable architecture, (v) operate with any size sample, (vi) operate multiple paths in parallel, (vii) bypass intermediate converters and/or (viii) be implemented as one or more integrated circuits.

Various embodiments provide an architecture that is scalable to perform high density mapping and unmapping (reverse mapping) in a multiple lane communication channel environment using nibble group packing buffers and unpacking buffers. The architecture is explained in terms of a Joint Electron Device Engineering Council standard JESD204 interface standard mapping. The architecture may be used for any such interface protocol and is easily expandable and scalable in all dimensions for a number of converters (e.g., M), a number of lanes (e.g., L), an oversampling size (e.g., S) and variable sample widths along with a capacity to transmit/receive partial samples to/from different lanes. The architecture also provides parallel pipelined data paths each with multiple (e.g., three) components (or stages) to accomplish high density mapping of variable width samples to multiple lanes.

Figure 1:
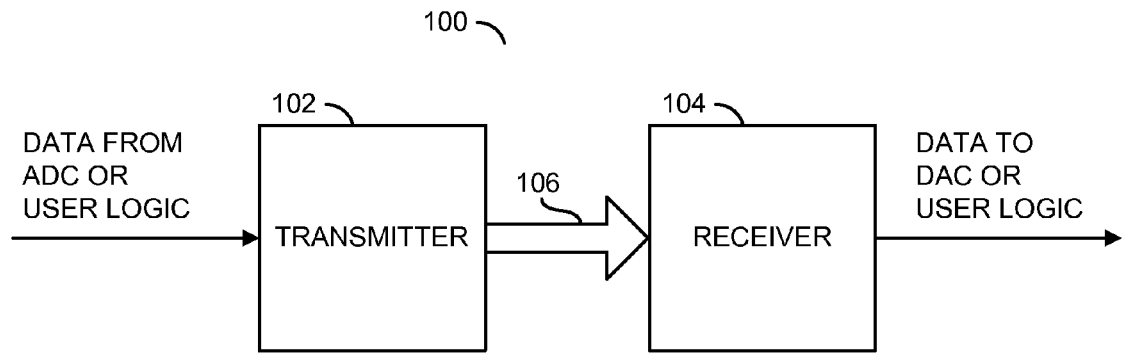
FIG. 1 is a block diagram of a system.

Referring to FIG. 1, a block diagram of an example embodiment of a system 100 is shown. The system (or apparatus, or device, or integrated circuit) 100 is shown implementing a multiple lane communication system. The apparatus 100 generally comprises a block (or circuit) 102, a block (or circuit) 104 and a block (or circuit) 106. The system 100 is operational to serialized parallel samples (or data) in a transmitter (e.g., circuit 102), transfer the serialized samples on (in) a communication channel (e.g., circuit 106) and subsequently deserialize the samples in a receiver (e.g., circuit 104) back into the parallel samples. The circuits 100 to 106 may represent modules and/or blocks that may be implemented as hardware, software, a combination of hardware and software, or other implementations.

The circuit 102 is shown implementing a transmitter circuit. The circuit 102 is generally operational to generate signals carrying samples to be communicated to the circuit 104. The samples are data received from a converter, such as an analog to digital converter, and/or user logic. The signals are communicated between the circuit 102 and the circuit 104 via the circuit 106. In various embodiments, the circuit 102 is fabricated as one or more integrated circuits (or die).

The circuit 102 arranges the incoming samples into multiple envelopes (or nibbles or units). The envelopes are subsequently packed into nibble groups. The nibble groups are arranged as adjoining octets (or bytes) of a frame. Each frame is transmitted (or inserted) in a lane of the circuit 106. For high density packing, some samples may be divided into partial samples with each part routed into a different frame. The partial samples in the different frames are transmitted in different lanes of the circuit 106 and reassembled in the circuit 104.

The circuit 104 is shown implementing a receiver circuit. The circuit 104 is generally operational to recover the samples from the signals received from the circuit 102 via the circuit 106. In various embodiments, the circuit 104 is fabricated as one or more integrated circuits (or die).

The circuit 104 receives the frames from the circuit 106 and recovers the samples. The octets of the frames are parsed back into the nibble groups. The nibble groups are unpacked to recreate the envelopes. The envelopes are used to recover the original samples. For partial samples received via the circuit 106, the circuit 104 is operational to recombine the pieces from the different frames to recover the sample.

The circuit 106 is shown implementing a communication channel. The circuit 106 is generally operational to carry the samples communicated from the circuit 102 to the circuit 104 in multiple lanes. Each lane of the circuit 106 operates as an independent channel. Implementations of the circuit 106 may include, but are not limited to, one or more transmission media such as air, wire, optical fibre and the like.

The Joint Electron Device Engineering Council standard JESD204 (e.g., version JESD204b) is a standard protocol for continuous and constant bandwidth transfer of data streams. In some embodiments, the circuit 102 is configured to transmit the serialized samples per the JESD204 standard. The circuit 104 is configured to receive the serialized samples per the JESD204 standard. Other standard protocols and/or custom protocols may be implemented to meet the criteria of a particular application.

The system 100 supports partial sample transmission and reception over different lanes of the circuit 106, thus enabling the high density packing of the samples. A nibble group buffer packing scheme is used to pack the samples into fixed sized sets. Other bit widths (e.g., octet packing or bitwise packing) may be implemented to meet the criteria of a particular application. Thus, the system 100 can handle variable packing widths and the high density packing of the samples. The circuits 102 and 104 provide sample envelope packing circuitry, transmit/receive engine circuits and lane buffer circuits in modular, repetitive and scalable arrangements that are suitable for interface application designs. No granular limitations are imposed on the width of the samples to be mapped and/or unmapped. The multiple pipeline paths can be operated in parallel to accelerate the mapping exclusively for each lane. At any point of time, the number of active paths can match the number of lanes. Furthermore, an ability is provided to disable bypass intermediate converters because the transmit/receive flow is per converter.

Figure 2:
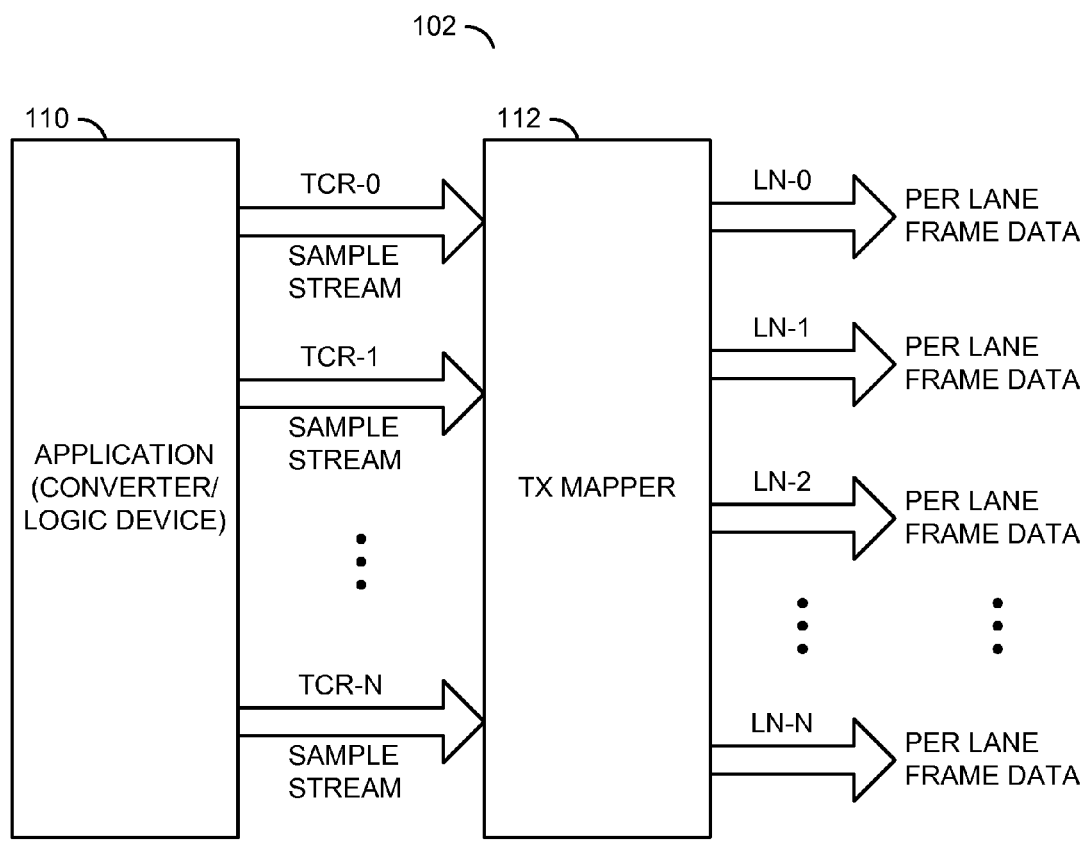
FIG. 2 is a block diagram of a transmitter circuit.

Referring to FIG. 2, a block diagram of an example implementation of the circuit 102 is shown. The circuit 102 generally comprises a block (or circuit) 110 and a block (or circuit) 112. The circuits 110 to 112 may represent modules and/or blocks that may be implemented as hardware, software, a combination of hardware and software, or other implementations.

Multiple signals (e.g., TCR-0 to TCR-N) are shown being generated by the circuit 110 and received by the circuit 112. Each signal TCR-0 to TCR-N carries a sequence of parallel samples to be transferred across the circuit 106 to the circuit 104 in per lane data frames. Multiple signals (e.g., LN-0 TO LN-N) are shown being generated by the circuit 112. Each signal LN-0 to LN-N carries serialized frame data that is subsequently transmitted (or inserted) in the circuit 106 and transferred to the circuit 104.

The circuit 110 is shown implementing an application circuit. The circuit 110 is operational to create the parallel sample streams in the signals TCR-0 to TCR-N. In various embodiments, the circuit 110 is a part of the circuit 102 (e.g., FIG. 2). In other embodiments, the circuit 110 is separate from the circuit 102 (e.g., FIG. 1).

The circuit 112 is shown implementing a transmit mapper circuit. The circuit 112 is operational to convert the parallel samples received via the signals TCR-0 to TCR-N into serial samples. The serial samples are mapped into high density serialized frames in the signals LN-0 to LN-N and are transferred over multiple lanes of the circuit 106 to the circuit 104.

Figure 3:
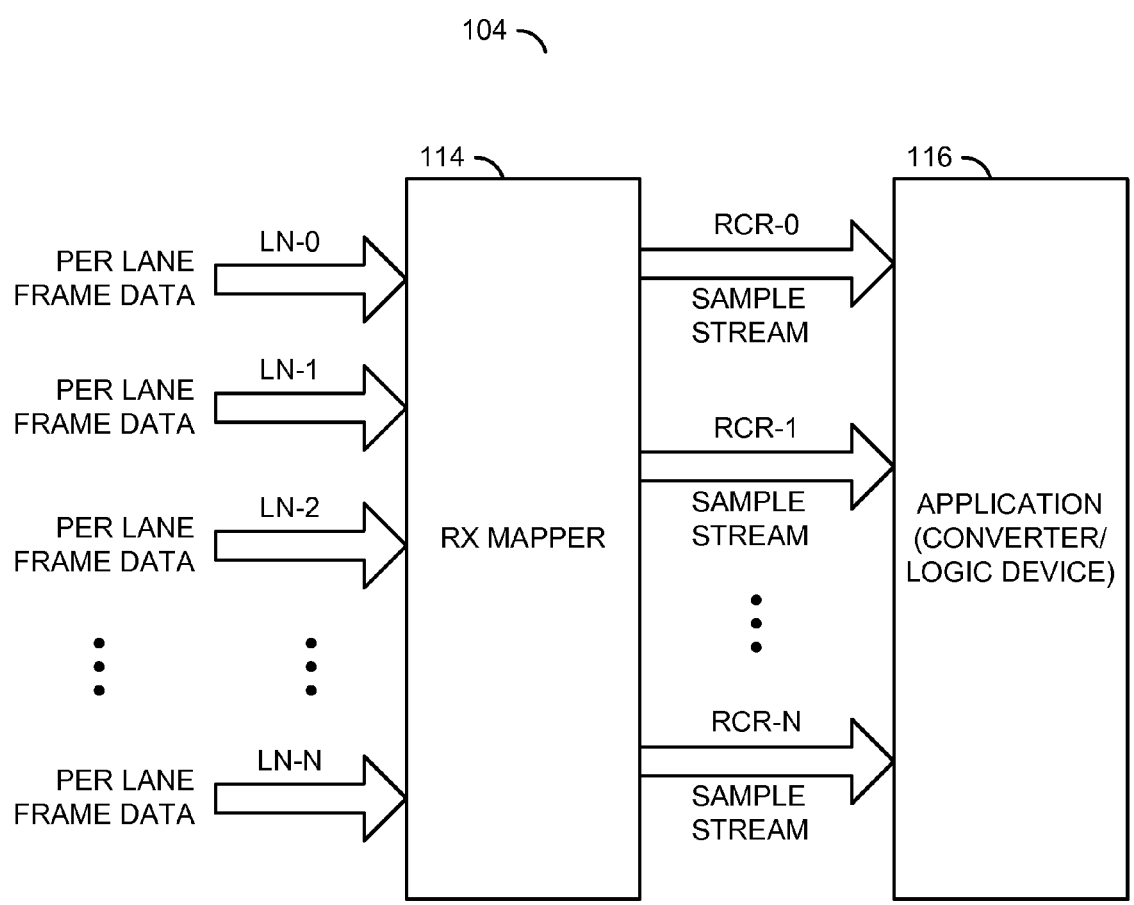
FIG. 3 is a block diagram of a receiver circuit.

Referring to FIG. 3, a block diagram of an example implementation of the circuit 104 is shown. The circuit 104 generally comprises a block (or circuit) 114 and a block (or circuit) 116. The circuits 114 to 116 may represent modules and/or blocks that may be implemented as hardware, software, a combination of hardware and software, or other implementations.

The signals LN-0 to LN-N are shown being received by the circuit 114 from the circuit 106. Multiple signals (e.g., RCR-0 to RCR-N) are shown being generated by the circuit 114 and received by the circuit 116. Each signal RCR-0 to RCR-N carries a sequence of parallel samples received from the circuit 102 through the circuit 106.

The circuit 114 is shown implementing a receive mapper circuit. The circuit 114 is operational to unmap the serial samples received in the high density serialized frames carried by the signals LN-0 to LN-N. The serial samples are subsequently converted into parallel samples. The parallel samples are presented to the circuit 116 in the signals RCR-0 to RCR-N.

The circuit 116 is shown implementing an application circuit. The circuit 116 contains one or more applications that are operational to consume the parallel sample streams in the signals RCR-0 to RCR-N. In various embodiments, the circuit 116 is a part of the circuit 104 (e.g., FIG. 2). In other embodiments, the circuit 116 is separate from the circuit 104 (e.g., FIG. 1).

Figure 4:
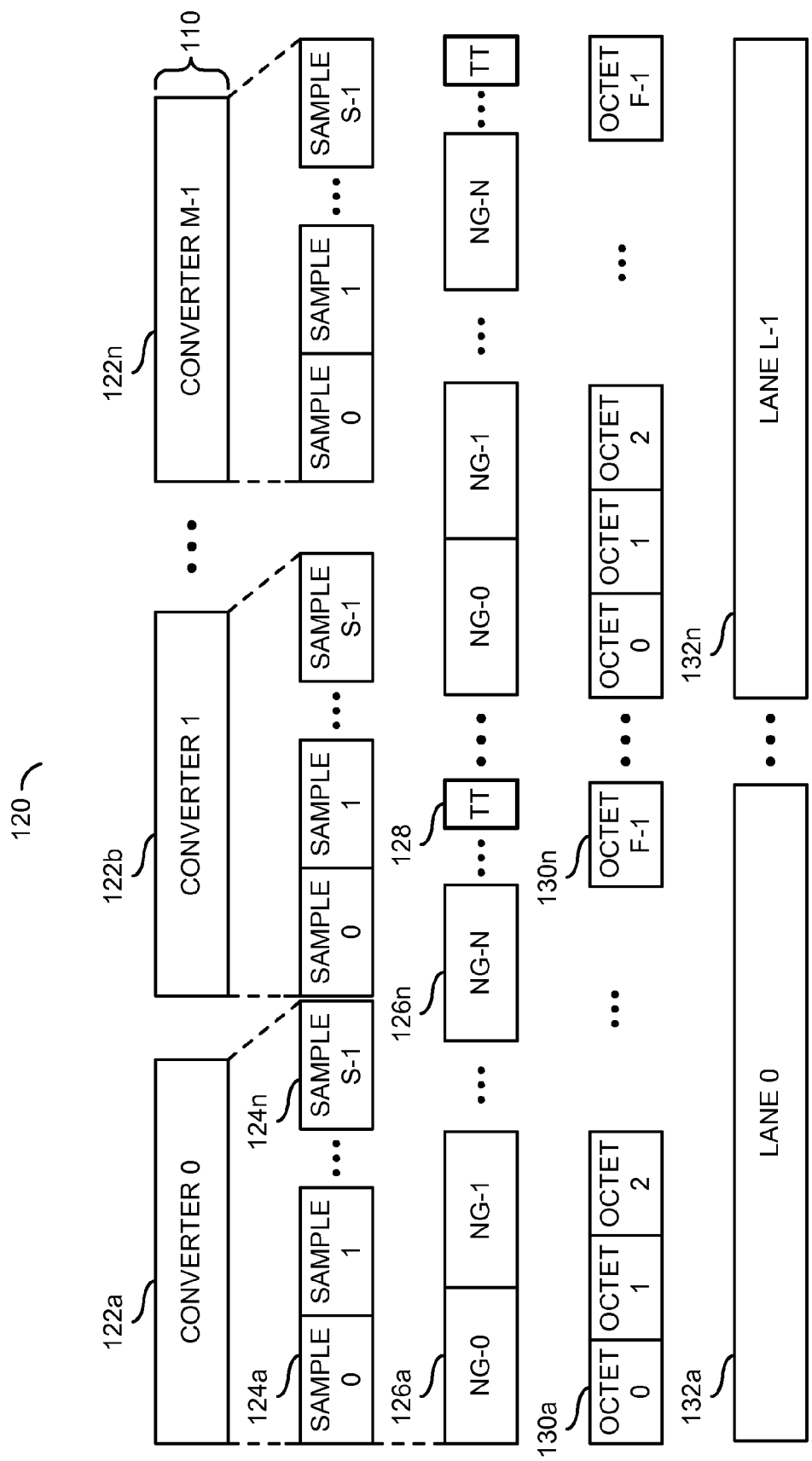
FIG. 4 is a diagram of a mapping of converters to multiple lanes.

Referring to FIG. 4, a diagram of an example mapping 120 of converters to multiple lanes is shown. The mapping 120 is generally bounded by one or more converters 122a-122n and multiple lanes 132a-132n. The converters 122a-122n are the source of the samples within the circuit 110. The samples are mapped to a linear axis to form "F" octet (or unit) frames, a frame per lane 132a-132n. The frames start with the samples 124a-124n generated by the converter 122a, followed by the samples from the converter 122b, the samples from the converter 122c, and so on until all converter samples have been mapped. Each sample 124a-124n (of width N) is converted to an extended sample 126a-126n (of width N') by appending additional bits (control bits or tail bits). The extended sample width N' is a whole (or integer) multiple of a fixed number. In embodiments where the fixed number is four, the extended sample width N' is generally referred to as a nibble group (e.g., NG). The nibble groups 126a-126n are subsequently mapped into multiple (e.g., F) octets 130a-130n. In a non-high density mode of operation, one or more control bits or tail bits (e.g., TT) 128 are generated to fill unused space in the last octet 130n. In a multiple lane high density mode of operation, the last octet 130n is completed with a partial sample instead of the tail bits 128. The remaining portion of partial sample is sent on the frame over a next lane.

Figure 5:
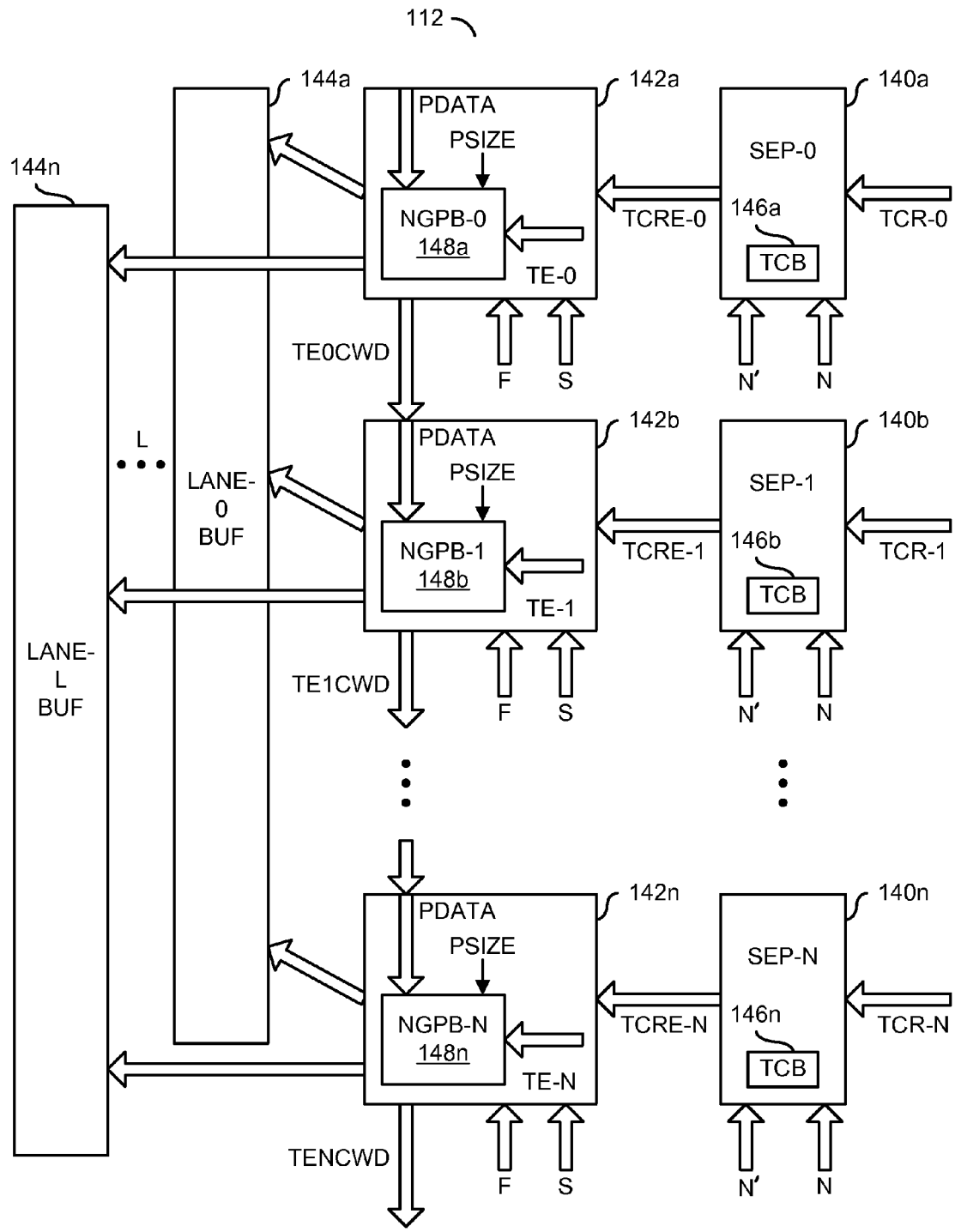
FIG. 5 is a block diagram of a transmit mapper circuit in accordance with an embodiment of the invention.

Referring to FIG. 5, a block diagram of an example implementation of the circuit 112 is shown in accordance with an embodiment of the invention. The circuit 112 generally comprises multiple blocks (or circuits) 140a-140n, multiple blocks (or circuits) 142a-142n and multiple blocks (or circuits) 144a-144n. The circuits 140a-140b comprise blocks (or circuits) 146a-146n. The circuits 142a-142n comprise blocks (or circuits) 148a-148n. The circuits 140a to 148n may represent modules and/or blocks that may be implemented as hardware, software, a combination of hardware and software, or other implementations.

The circuits 140a-140n are shown implementing sample envelope processor (e.g., SEP) circuits. The circuits 140a-140n receive respective signals TCR-0 to TCR-N. Multiple signals (e.g., TCRE-0 to TCRE-N) are generated respectively by the circuits 140a-140n. The signals TCRE-0 to TCRE-N convey envelopes containing the samples 124a-

124*n* received in the signals TCE-0 to TCR-N. Multiple signals (e.g., N) are received by the circuits 140*a*-140*n*. The signals N carry sizes of the samples in the signals TCR-0 to TCR-N. Multiple signals (e.g., N') are received by the circuits 140*a*-140*n*. The signals N' carry the extended sizes of the samples.

The circuits 142*a*-142*n* are shown implementing transmit engine (e.g., TE) circuits. The circuits 142*a*-142*n* receive the signal TCRE-0 to TCRE-N from the circuits 140*a*-140*n*, respectively. Multiple signals (e.g., F) are received by the circuits 142*a*-142*n*. The signals F convey the number of octets per frame. Multiple signals (e.g., S) are received by the circuits 142*a*-142*n*. The signals S convey the oversampling data sizes. Each circuit 142*a*-142*n* generates a signal (e.g., TE0CWD to TENCWD) that is received by a neighboring circuit 142*a*-142*n*. The signals TE0CWD to TENCWD are transmit engine command words that convey an octet counter value F-count, an active lane number, partial sample data (e.g., PDATA), and a nibble count value (e.g., PSIZE).

The circuits 144*a*-144*n* are shown implementing lane buffer circuits. Each circuit 144*a*-144*n* is operational to buffer frames to be transmitted in a corresponding lane of the circuit 106.

The circuits 146*a*-146*n* are shown implementing tail/control bits buffer (e.g., TCB) circuits. In various embodiments, each circuit 146*a*-146*n* is implemented as a first-in-first-out buffer.

The circuits 148*a*-148*n* are shown implementing nibble group packing buffer (e.g., NGPB) circuits. Each circuit 148*a*-148*n* is operational to buffer the nibbles as the nibble groups 126*a*-126*n* are appended together into the octets 130*a*-130*n*.

A dataflow is maintained in the circuit 112 per a converter stream in a linear axis. For example, the circuits 140*a* and 142*a* process the converter stream signal TCR-0. Similarly, the circuits 140*b* and 142*b* process the converter stream signal TCR-1, and so on. The circuits 140*n* and 142*n* process the converter stream signal TCR-n. The circuits 144*a*-144*n* are accessed by the circuits 142*a*-142*n* in a round robin fashion. The circuits 142*a*-142*n* pass control information and access for the circuits 144*a*-144*n* to the next circuit 142*a*-142*n* via the signal TE0CWD to TENCWD.

Figure 6:
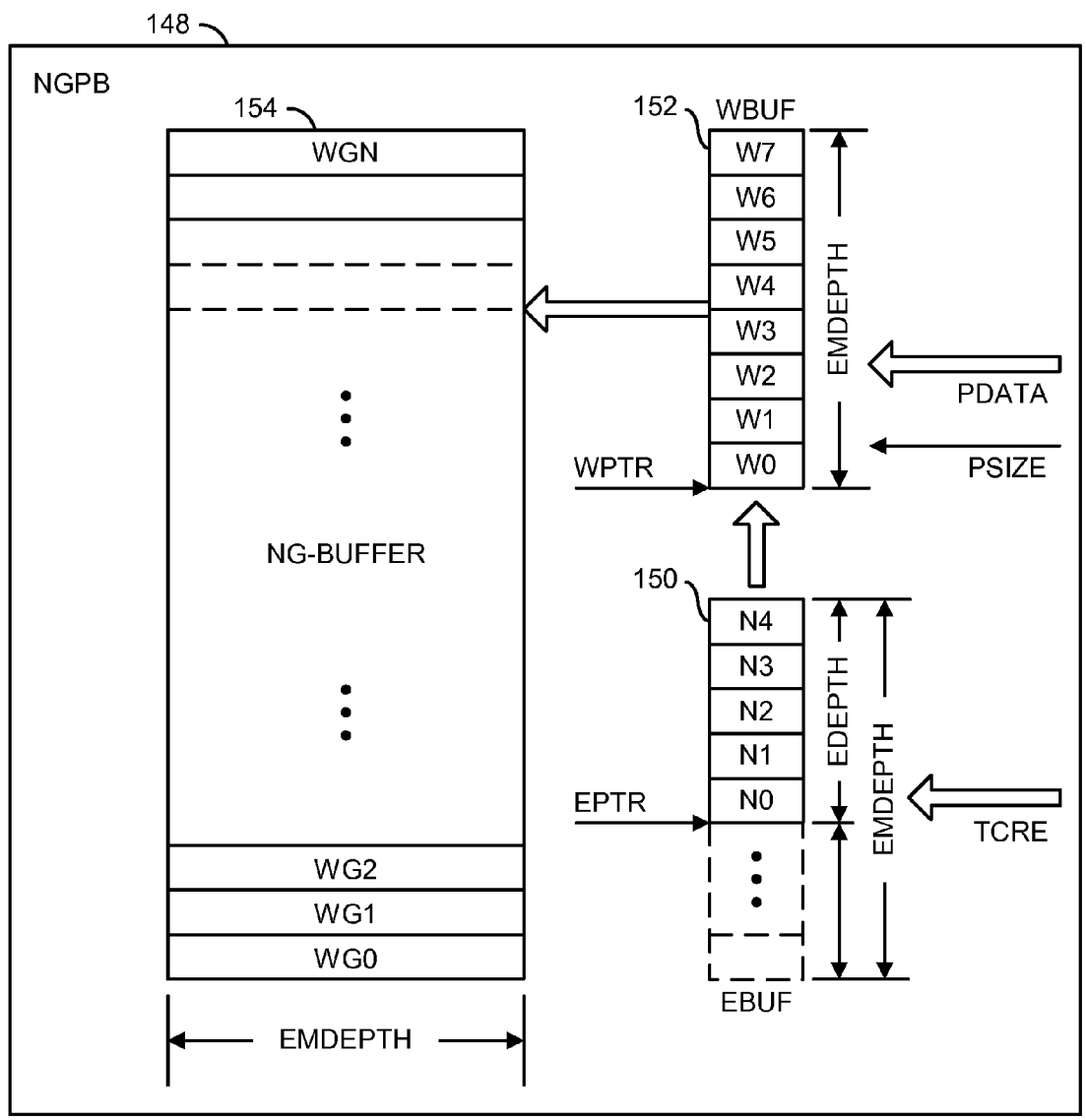
FIG. 6 is a block diagram of a packing buffer circuit.

Referring to FIG. 6, a block diagram of an example implementation of a circuit 148 is shown. The circuit 148 represents the circuits 148*a*-148*n*. The circuit 148 generally comprises a block (or circuit) 150, a block (or circuit) 152 and a block (or circuit) 154. The circuits 150 to 154 may represent modules and/or blocks that may be implemented as hardware, software, a combination of hardware and software, or other implementations. The circuit 148 is operational to support a respective circuit 142*a*-142*n* to perform the variable width high density sample packing in the transmit path.

Mapping the converter samples in the transmit path involves multiple steps. In a step 1, one or more of the circuits 140*a*-140*n* receives the sample stream signals TCR-0 to TCR-N from the respective converters and transforms the signals TCR-0 to TCR-N into the sample envelope stream signals TCRE-0 to TCRE-N. In various embodiments, the samples are received on the most significant bits of a bus that has a physical width matching a maximum supported sample size (e.g., EMDEPTH nibbles). In the circuits 140*a*-140*n*, the width N samples are appended with tail/control bits taken from the circuits 146*a*-146*n* to form sample envelopes of width N'. A number of the sample envelopes is rounded upward to an integer multiple of the nibble size (e.g., N' is an integer multiple of nibbles).

In a step 2, the circuits 142*a*-142*n* receive the sample envelopes in the signals TCRE-0 to TCRE-N. The sample envelopes are received on the upper N' bits (e.g., EDEPTH bits) of a bus that is EMDEPTH bits wide. For example, if a maximum allowed sample envelope size is 32 bits (e.g., EMDEPTH=8 nibbles, each nibble=4 bits), the data path width is also 32 bits. In another example, the converter sample signals TCR-0 to TCR-N are programmed to an 18-bit size (e.g., N=18). Therefore, the affected sample envelope signals TCRE-0 to TCRE-N are rounded upward to 20 bits (e.g., N'=20 bits, EDEPTH=5 nibbles, each nibble=4 bits) which maps into 5 nibble groups (e.g., 18 bits along with 2 tail bits).

In a step 3, the circuits 142*a*-142*n* process the sample envelopes inside the circuits 148*a*-148*n* to accomplish the nibble group packing. Referring again to FIG. 6, the circuit 148 generally comprises the envelope buffer (e.g., EBUF) circuit 150, the write buffer (e.g., WBUF) circuit 152 and the nibble group buffer (e.g., NG-BUFFER) circuit 154. The physical depth of the circuit 150 supports the maximum sample envelope size (e.g., EMDEPTH). However, based on the sample envelope size configuration, only the programmable depth is used (e.g., N' bits or EDEPTH nibbles). In the example, the circuit 150 is a 32-bit deep register with the upper 20 bits (e.g., N' bits) used as the programmed depth (e.g., EDEPTH). The circuit 152 is an EMDEPTH-bit deep register in the example. The circuit 154 loads parallel data (e.g., PDATA) and the nibble count (e.g., PSIZE) from the previous circuit 142*a*-142*n* to the circuit 152 and a word pointer (e.g., WPTR) of the circuit 142*a*-142*n*. The circuit 154 is shown implementing a first-in-first-out buffer for intermediate storage of packed samples within respective circuit 142*a*-142*n* before the samples are moved to the currently active lane buffer circuit 144*a*-144*n*.

In a step 4, an envelope pointer (e.g., EPTR) counts a number of nibbles in the circuit 150. When the pointer EPTR has a reset value of zero (e.g., the number of nibbles in the circuit 150 is zero), a newly received sample envelope width of data in the signal TCRE is written to the upper bits of the circuit 150. The pointer EPTR increments by counting the number of nibbles received. In the example, a sample envelope received from a corresponding circuit 140*a*-140*n* (e.g., 140*a*) has 20 bits. The pointer EPTR is set to a value of 5 (e.g., EDEPTH=5 nibbles, nibble=4 bits) after the write. A nibble N0 stores the lower 4 bits of the sample, a nibble N1 stores the next 4 bits and so on up to storing of the uppermost 4 bits of the sample envelope in the nibble N4.

In a step 5, a maximum possible number of nibbles are shifted from the circuit 150 to the circuit 152 in single clock cycle until the circuit 152 becomes full. Initially, the pointer WPTR is reset to zero. The pointer WPTR is incremented by the number of nibbles shifted. The nibbles previously written and still stored in the circuit 152 are also shifts upwards to higher nibbles by the same number. In the example, the circuit 152 has eight empty nibble positions. The circuit 150 has 5 available nibbles and thus all 5 nibbles (e.g., N0-N4) are shifted into the circuit 152 in a single clock cycle. The shift of 5 nibbles results in moving (or copying) the nibble N0 to W0, the nibble N1 to W1 and so on until the nibble N4 is placed in W4. The pointer WPTR is set to the value 5 and can take another shift of up to 3 nibbles.

In a step 6, if the circuit 150 becomes empty due to the shift (e.g., the pointer EPTR has a zero value), a next sample envelope width of data is written to the circuit 150. In the example, after the original 5 nibbles are shifted, the circuit 150 is empty and the pointer EPTR decrements to zero, the corresponding circuit 140a writes the next sample envelope in the signal TCRE-0 to the circuit 150. The pointer EPTR increases to the value of 5 again as 5 nibbles are available in circuit 150.

In a step 7, the step 5 is repeated after the next sample envelope is written to the circuit 150. In the example, the maximum number of nibbles that could be shifted from the circuit 150 to the circuit 152 is 3, as only 3 empty nibble spaces are available in the circuit 152. As a result of shifting 3 nibbles from the circuit 150 to the circuit 152, the nibble W4 is shifted to W7, the nibble W3 is shifted to W6 and so on until the nibble W0 is shifted to W3. Furthermore, 3 nibbles in the circuit 150 are shifted to the circuit 152 and the remaining 2 nibbles are shifted inside the circuit 150 such that the nibble N4 is shifted to W2, the nibble N3 to W1, the nibble N2 to W0, the nibble N1 to N4 and the nibble N0 to N3. The pointer EPTR thus has a value of 2 as the two nibbles are still available in the circuit 150 and no additional application write happens to the circuit 150. Furthermore, the pointer WPTR has a value of 8 after the shifting and so the circuit 152 is full.

In a step 8, when the circuit 152 is full and pointer WPTR is at EMDEPTH nibbles, the 8 nibbles (e.g., a word) are moved (or stored) into the circuit 154. At the end of the step 8, the circuit 152 is empty again and the pointer WPTR resets to zero. Step 5 follows to fill the circuit 152 from the circuit 150. In the example, a word is written from the circuit 152 to the circuit 154. The circuit 152 becomes empty and has 8 nibble positions after the write. Since the circuit 150 is not empty and has 2 nibbles available, a shift of the 2 remaining nibbles is less than the 8 maximum possible shifts. The shift takes place and the circuit 150 becomes empty, the pointer EPTR is reset to zero and the pointer WPTR increases to a value of 2. Steps 6 to 8 are repeated for the next samples.

In a step 9, a corresponding circuit 142a-142n (e.g., 142a) reads S samples (oversampling ratio) from the circuit 140a and processes the samples within the circuit 148. The circuit 142a also reads the circuit 154 and transfers the packed samples to an active buffer circuit 144a-144n (e.g., 144a). The circuit 142a also maintains an octet counter (e.g., F-count) which incrementally counts the bytes transferred from the circuit 148 to the circuit 144a.

In a step 10, after the S samples have been processed by circuit 142a, control is transferred to the next circuit 142b along with the transmit engine command word TE0CWD. The command word also transfers the octet counter value F-count, the active lane number, the contents of the circuit 152 (e.g., partial sample PDATA) and the pointer WPTR (e.g., nibble count PSIZE) value to the next circuit 142b. The next circuit 142b loads the partial sample (e.g., PDATA) to the internal circuit 150 and the nibble count value (e.g., PSIZE) to the pointer WPTR through a signal PDATA interface and a signal PSIZE interface. Steps 1 to 10 are repeated for the next circuit 142b. Thus, if a frame being assembled for an active lane still has space for more samples when control is transferred from the circuit 142a to the circuit 142b, the circuit 142b finishes filling the active lane. Once the F-count reaches the value of F, the active circuit 144a-144n is changed to the next circuit 144a-144n (e.g., change lane-0 buffer to lane-1 buffer).

Figure 7:
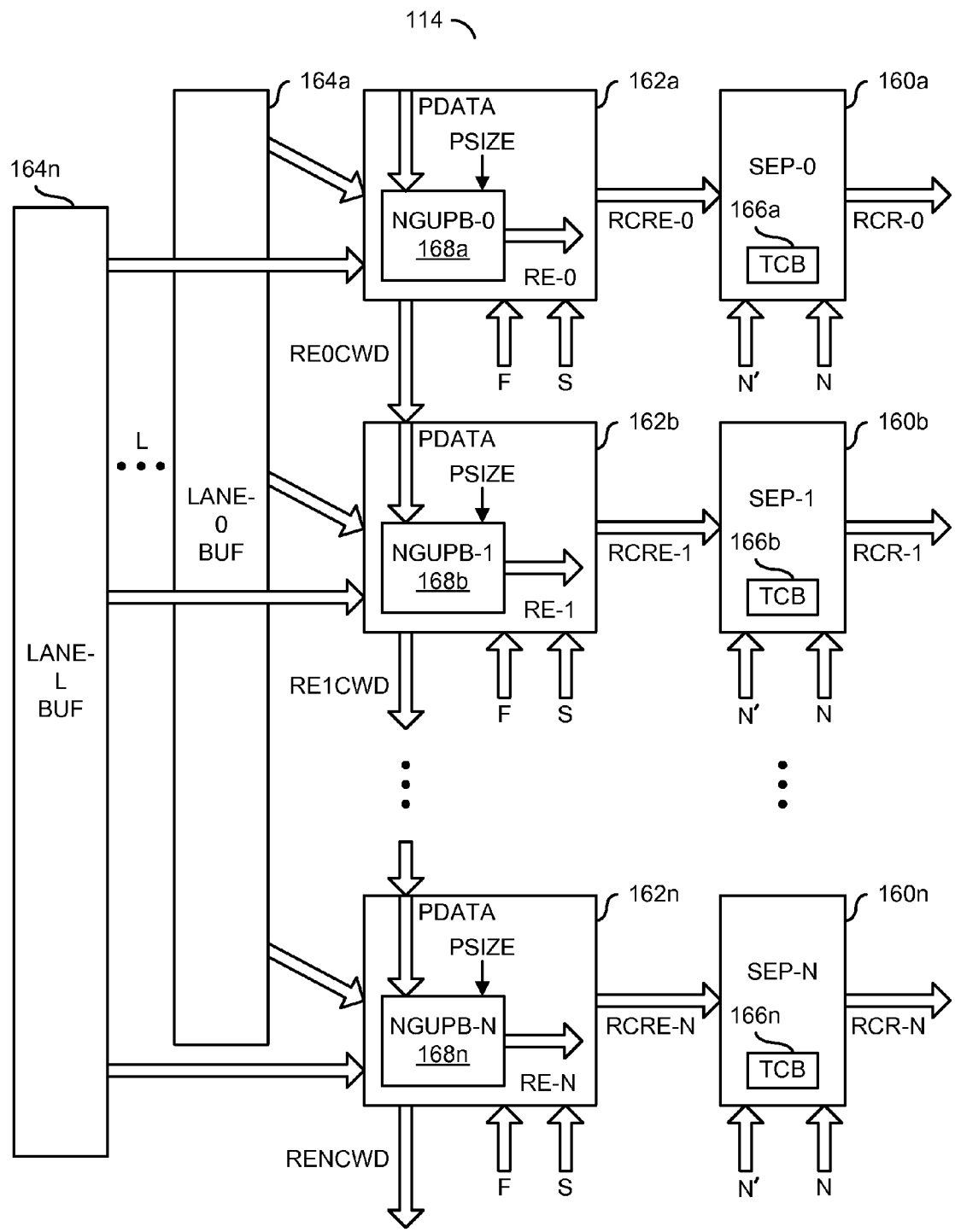
FIG. 7 is a block diagram of a receive mapper circuit.

Referring to FIG. 7, a block diagram of an example implementation of the circuit 114 is shown. The circuit 114 generally comprises multiple blocks (or circuits) 160a-160n, multiple blocks (or circuits) 162a-162n and multiple blocks (or circuits) 164a-164n. The circuits 160a-160b comprise blocks (or circuits) 166a-166n. The circuits 162a-162n comprise blocks (or circuits) 168a-168n. The circuits 160a to 168n may represent modules and/or blocks that may be implemented as hardware, software, a combination of hardware and software, or other implementations.

The circuits 160a-160n are shown implementing sample envelope processor circuits. The circuits 160a-160n each receive a respective signal (e.g., RCRE-0 to RCRE-N). The signals RCRE-0 to RCRE-N convey envelopes containing the samples 124a-124n received in the frames via the circuit 106. The signals RCR-0 to RCR-N are generated respectively by the circuits 160a-160n. The signals N are received by each circuit 160a-160n. The signals N carry sizes of the samples in the signals RCRE-0 to RCRE-N. The signals N' are received by each circuit 160a-160n. The signals N' carry the extended sizes of the samples.

The circuits 162a-162n are shown implementing receive engine (e.g., RE) circuits. The circuits 162a-162n generate and send the signals RCRE-0 to RCRE-N to the circuits 160a-160n, respectively. The signals F are received by the circuits 162a-162n. The signals F convey the number of octets per frame. The signals S are received by the circuits 162a-162n. The signals S convey the oversampling data sizes. Each circuit 162a-162n generates a signal (e.g., RE0CWD to RENCWD) that is received by a neighboring circuit 162a-162n. The signals RE0CWD to RENCWD are receive engine command words that convey an octet counter value F-count, an active lane number, partial sample data (e.g., PDATA), and a nibble count value (e.g., PSIZE).

The circuits 164a-164n are shown implementing lane buffer circuits. Each circuit 164a-164n is operational to buffer frames received in a corresponding lane of the circuit 106.

The circuits 166a-166n are shown implementing tail/control bits buffer (e.g., TCB) circuits. In various embodiments, each circuit 166a-166n is implemented as a first-in-first-out buffer.

The circuits 168a-168n are shown implementing nibble group unpacking buffer (e.g., NGUPB) circuits. Each circuit 168a-168n is operational to buffer the nibbles as the nibble groups 126a-126n are unpacked from the octets 130a-130n.

A dataflow is maintained in the circuit 114 per a converter stream in a linear axis. For example, the circuits 160a and 162a recreate the converter stream signal TRC-0 as the signal RCR-0. Similarly, the circuits 160b and 162b recreate the converter stream signal TCR-1 as the signal RCR-1, and so on. The circuits 160n and 162n recreate the converter stream signal TCR-N as the signal RCR-N. The circuits 164a-164n are accessed by the circuits 162a-162n in a round robin fashion. The circuits 162a-162n pass control information and access of the circuits 164a-164n to the next circuit 162a-162n via the signal RE0CWD to RENCWD. The active circuits 164a-164n are switched to next circuits 164a-164n once F octets have been retrieved.

Figure 8:
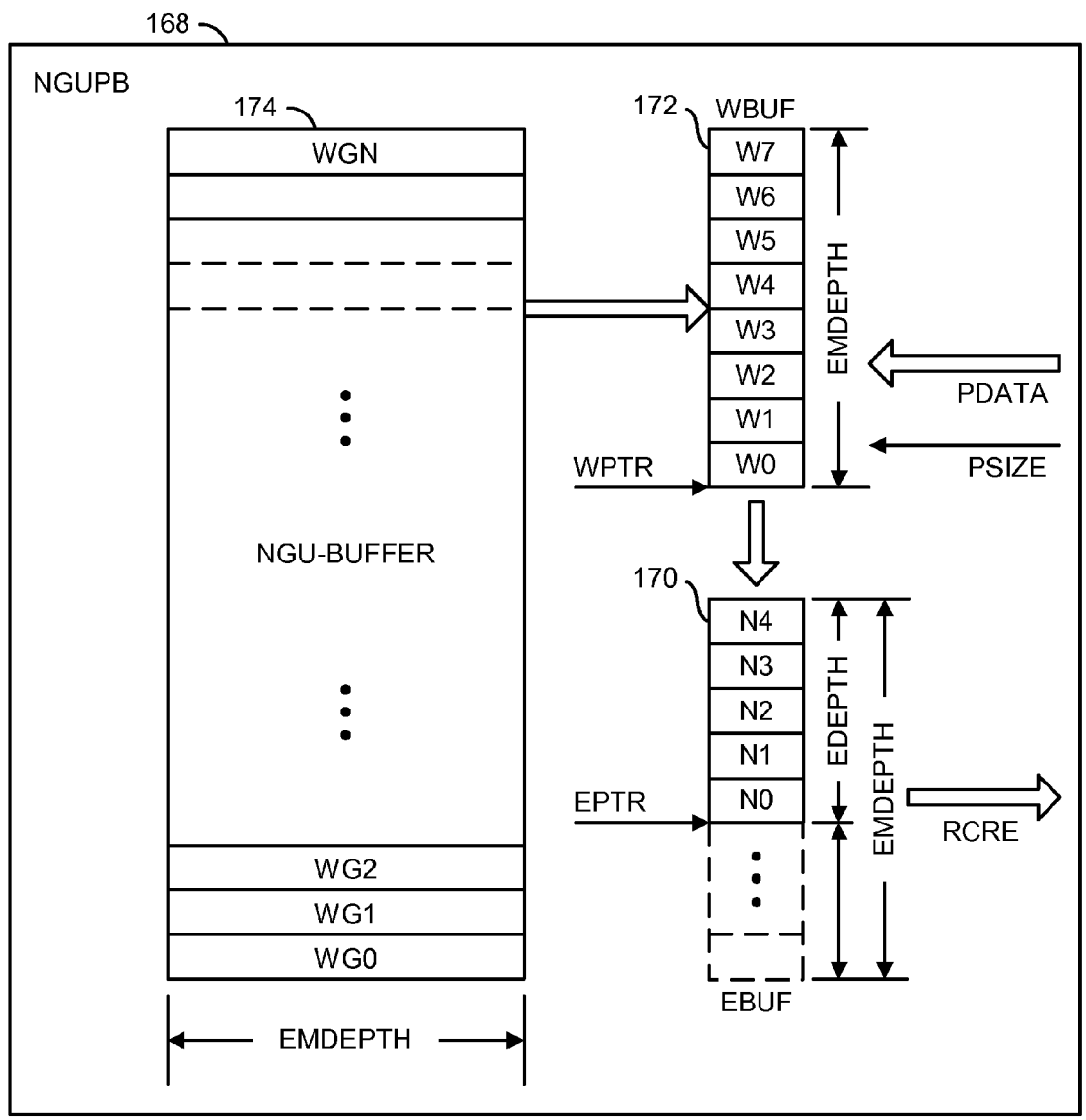
FIG. 8 is a block diagram of an unpacking buffer circuit.

Referring to FIG. 8, a block diagram of an example implementation of a circuit 168 is shown. The circuit 168 represents the circuits 168a-168n. The circuit 168 generally comprises a block (or circuit) 170, a block (or circuit) 172 and a block (or circuit) 174. The circuits 170 to 174 may represent modules and/or blocks that may be implemented as hardware, software, a combination of hardware and software, or other implementations. The circuit 168 is operational to support a respective circuit 162a-162n to perform the variable width high density sample unpacking in the receive path.

Mapping the converter samples in the receive path involves multiple steps. In a step 1, the circuits 162a-162n read the circuits 164a-164n for the S samples, which correspond to converter stream signals RCR-0 to RCR-N. The frame words from the circuits 164a-164n are read and stored in the circuits 168a-168n for further processing. Each circuit 162a-162n also counts the number of octets read from a corresponding active circuit 164a-164n (F-Count) and passes the count to the next respective circuit 162a-162n, which again reads the same buffer (e.g., finishes parsing the frame) and increments the count further. Once the F-Count reaches a value of F, active circuits 164a-164n are changed to the next respective circuits 164a-164n (e.g., change lane-0 to lane-1).

In a step 2, the control information RE0CWD-RENCWD, which carries the active lane buffer, the F-Count, the remaining samples (or partial samples) along with the number of nibbles (e.g., PSIZE) are transferred to the next circuits 162a-162n after S samples have been processed by the current circuits 162a-162n.

In a step 3, the circuits 162a-162n retrieve the sample envelopes in the signals RCRE-0 to RCRE-N inside the circuits 168a-168n to accomplish the nibble group unpacking. The circuit 168 includes the circuit 170, the circuit 172 and the circuit 174. The physical depth of the circuit 170 supports a maximum sample envelope size (e.g., EMDEPTH). However, based on a sample envelope size configuration only a programmable depth is used (e.g., N' bits or EDEPTH nibbles). The circuit 172 is implemented as an EMDEPTH-bit deep register. The circuit 168 loads the parallel data (e.g., PDATA) and the nibble count size (e.g., PSIZE) from a previous circuit 162a-162n to the circuit 172 and the pointer WPTR of a next circuit 162a-162n.

In a step 4, when the circuit 172 is empty (e.g., the pointer WPTR is 0), the sample octets from circuit 174 are moved (or loaded) into the circuit 172 and the pointer WPTR is adjusted to the value of EMDEPTH (e.g., the number of nibbles moved).

In a step 5, a maximum number of nibbles are transferred (or shifted) to the circuit 170 and the pointer EPTR is incremented accordingly in a single clock cycle.

In a step 6, when the pointer EPTR indicates that the circuit 170 is full, the nibbles in the circuit 170 are passed to the respective circuits 160a-160n.

In a step 7, the circuits 160a-160n process the stream signals RCRE-0 to RCR-N and separate the samples and the tail bit information (e.g., remove the pad bits). The information is made available to the circuit 116.

In a step 8, the steps 1 to 7 are repeated for all the circuits 162a-162n and restarted again for the circuit 162a after all the circuits 162a-162n have been covered.

In various embodiments, the widths of the circuit 154, the circuit 174 and respective circuits 152 and 172 are same and are set at the value EMDEPTH. In some embodiments, the widths of the circuit 154 and the circuit 174 are different to account for different data path widths. The widths of the circuits 144a-144n are the same as the circuit 154 (e.g., EMDEPTH). The widths of the circuits 164a-164n are the same as the circuit 174.

The circuits 144a-144n and 164a-164n are read/written by serialization-deserialization (e.g., SerDes) circuitry in the respective circuits 102 and 104. In the transmit path, the circuits 144a-144n send parallel data to one or more serializers (e.g., SerDes transmit paths) that connect to the circuit 104 on the other side of the interconnect. The circuit 104 transfers the serial data to one or more deserializers (e.g., SerDes receive paths) that deserialize the streams. The resulting parallel data is received by the circuits 164a-164n.

In each circuit 140a-140n, a sample (of width N) is converted to extended sample (of width N') by appending additional bits (e.g., the control bits or the tail bits). The extended sample width N', is a whole multiple of an integer (e.g., 4) and thus forms the nibble group. The circuits 146a-146n store a few bits that are chosen by a host computer or software to obtain the nibble group N' from the sample of width N. Each circuit 140a-140n fetches the samples from the circuit 110 (e.g., an application or an analog to digital converter) and sends the samples to the circuits 148a-148n when the circuits 148a-148n indicate that the circuit 152 can receive the same. Thus, the circuits 148a-148n regulates a flow of the data from the circuits 140a-140n. A similar flow regulation applies for the receive paths.

The tail/control bits buffer circuits 148a-148n and 168a-168n are shown as components of circuits 140a-140n and 160a-160n. The circuits 140a-140n and 160a-160n read/write converter samples from/to the applications in transmit/receive paths processing. A read/write flow of the circuits 140a-140n and 160a-160n is regulated by the NGPB/NGUPB processing.

The functions performed by the diagrams of FIGS. 1-8 may be implemented using one or more of a conventional general purpose processor, digital computer, microprocessor, microcontroller, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the specification, as will be apparent to those skilled in the relevant art(s). Appropriate software, firmware, coding, routines, instructions, opcodes, microcode, and/or program modules may readily be prepared by skilled programmers based on the teachings of the disclosure, as will also be apparent to those skilled in the relevant art(s). The software is generally executed from a medium or several media by one or more of the processors of the machine implementation.

The invention may also be implemented by the preparation of ASICs (application specific integrated circuits), Platform ASICs, FPGAs (field programmable gate arrays), PLDs (programmable logic devices), CPLDs (complex programmable logic devices), sea-of-gates, RFICs (radio frequency integrated circuits), ASSPs (application specific standard products), one or more monolithic integrated circuits, one or more chips or die arranged as flip-chip modules and/or multi-chip modules or by interconnecting an appropriate network of conventional component circuits, as is described herein, modifications of which will be readily apparent to those skilled in the art(s).

The invention thus may also include a computer product which may be a storage medium or media and/or a transmission medium or media including instructions which may be used to program a machine to perform one or more processes or methods in accordance with the invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, magnetic disk, optical disk, CD-ROM, DVD and magneto-optical disks and circuits such as ROMs (read-only memories), RAMS (random access memories), EPROMs (erasable programmable ROMs), EEPROMs (electrically erasable programmable ROMs), UVPROM (ultra-violet erasable programmable ROMs), Flash memory, magnetic cards, optical cards, and/or any type of media suitable for storing electronic instructions.

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, audio storage and/or audio playback devices, video recording, video storage and/or video playback devices, game platforms, peripherals and/or multi-chip modules. Those skilled in the relevant art(s) would understand that the elements of the invention may be implemented in other types of devices to meet the criteria of a particular application.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
   a plurality of buffers configured to store a plurality of frames to be transmitted in a plurality of respective lanes of a communication channel;
   a first circuit configured to (i) generate a plurality of first groups from a first number of a plurality of samples such that a given one of said samples is split into an initial portion and a final portion and such that at least one of said first groups contains the initial portion of the given one of said samples and not the final portion, and (ii) generate a first of said frames by appending said first groups; and
   a second circuit configured to (i) receive the final portion of said given sample from said first circuit, (ii) generate a plurality of second groups from said final portion of said given sample and a second number of said samples and (iii) generate a second of said frames by appending said second groups.

2. The apparatus according to claim 1, further comprising a third circuit configured to generate a plurality of units of fixed size from said samples.

3. The apparatus according to claim 2, wherein said third circuit is further configured to pad at most one of said units with one or more bits.

4. The apparatus according to claim 2, wherein at least one of said units is said final portion of said given sample transferred from said first circuit to said second circuit.

5. The apparatus according to claim 1, wherein at least one of said samples in said first group has a different size than at least one of said samples in said second group.

6. The apparatus according to claim 1, further comprising a third circuit configured to (i) receive control of said second frame from said second circuit, (ii) generate a plurality of third groups from a third number of said samples and (iii) finish generating said second frame by appending said third groups to said second groups.

7. The apparatus according to claim 1, further comprising:
   a plurality of additional buffers configured to store said frames received from said respective lanes of said communication channel;
   a third circuit configured to (i) regenerate said first groups by parsing said first frame, (ii) separate said first number of said samples and said initial portion of said given sample from said first groups; and
   a fourth circuit configured to (i) regenerate said second groups by parsing said second frame, (ii) separate said second number of said samples and said final portion of said given sample from said second groups and (iii) transfer said final portion of said given sample to said third circuit.

8. The apparatus according to claim 1, wherein said apparatus is implemented as one or more integrated circuits.

9. An apparatus comprising:
   a plurality of buffers configured to store a plurality of frames received from a plurality of respective lanes of a communication channel;
   a first circuit configured to (i) generate a plurality of first groups by parsing a first of said frames and (ii) separate a first number of a plurality of samples and an initial portion of a given one of said samples from said first groups; and
   a second circuit configured to (i) generate a plurality of second groups by parsing a second of said frames, (ii) separate a second number of said samples and a final portion of said given sample from said second groups and (iii) transfer said final portion of said given sample to said first circuit.

10. The apparatus according to claim 9, wherein said first circuit is further configured to generate a plurality of units of fixed size by parsing said first groups.

11. The apparatus according to claim 10, wherein at least one of said units is said final portion of said given sample transferred from said second circuit to said first circuit.

12. The apparatus according to claim 10, further comprising a third circuit configured to regenerate said samples from said units parsed from said first groups.

13. The apparatus according to claim 12, wherein said third circuit is further configured to remove one or more bits of padding from at most one of said units parsed from said first groups.

14. The apparatus according to claim 9, wherein at least one of said samples in said first group has a different size than at least one of said samples in said second group.

15. The apparatus according to claim 9, further comprising a third circuit configured to (i) receive control of said second frame from said second circuit, (ii) generate a plurality of third groups by finishing said parsing of said second frame and (iii) separate a third number of said samples from said third group.

16. The apparatus according to claim 9, wherein said apparatus is implemented as one or more integrated circuits.

17. An apparatus comprising:
a plurality of buffers to store a plurality of frames transmitted in a plurality of respective lanes of a communication channel;
a first circuit to (i) generate a plurality of first groups from a first number of a plurality of samples, wherein at least one of said first groups contains an initial portion of a given one of said samples, and (ii) generate a first of said frames by appending said first groups;
a second circuit to (i) receive a final portion of said given sample from said first circuit, (ii) generate a plurality of second groups from said final portion of said given sample and a second number of said samples, and (iii) generate a second of said frames by appending said second groups; and
a third circuit to (i) receive control of said second frame from said second circuit, (ii) generate a plurality of third groups from a third number of said samples, and (iii) finish generating said second frame by appending said third groups to said second groups.

18. An apparatus comprising:
a plurality of buffers configured to store a plurality of frames to be transmitted in a plurality of respective lanes of a communication channel;
a first circuit configured to (i) generate a plurality of first groups from a first number of a plurality of samples, wherein at least one of said first groups contains an initial portion of a given one of said samples, and (ii) generate a first of said frames by appending said first groups; and
a second circuit configured to (i) receive a final portion of said given sample from said first circuit, (ii) generate a plurality of second groups from said final portion of said given sample and a second number of said samples and (iii) generate a second of said frames by appending said second groups, wherein:
in a first mode, the first circuit performs operations i) and ii) of the first circuit, and the second circuit performs operations i), ii), and ii) of the second circuit; and
in a second mode:
the first circuit a) generates the plurality of first groups from the first number of the plurality of samples so that the at least one of said first groups does not contain the initial portion of the given one of said samples, and b) generates the first of said frames by appending said first groups; and
the second circuit a) receives the initial portion and the final portion of said given sample from the first circuit, b) generates the plurality of second groups from said initial portion and said final portion of said given sample, and c) generates the second of said frames by appending said second groups.

19. The apparatus of claim 18, wherein, in the second mode, the first circuit pads the at least one of said first groups with tail bits.

20. The apparatus of claim 18, wherein the first mode is a high density mode and the second mode is a non-high density mode.

* * * * *